(12) United States Patent
Kim et al.

(10) Patent No.: US 11,302,837 B2
(45) Date of Patent: Apr. 12, 2022

(54) SOLAR CELL PANEL AND METHOD FOR MANUFACTURING THE SAME

(71) Applicant: LG ELECTRONICS INC., Seoul (KR)

(72) Inventors: Jungguen Kim, Seoul (KR); Jangyong Kim, Seoul (KR); Yong Song, Seoul (KR); Junghwan Yeom, Seoul (KR); Jeonghun Woo, Seoul (KR); Joonho Jeon, Seoul (KR); Youngbok Jung, Seoul (KR); Yoonsuk Choi, Seoul (KR); Eonjoo Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/825,793

(22) Filed: Mar. 20, 2020

(65) Prior Publication Data

US 2020/0313012 A1 Oct. 1, 2020

(30) Foreign Application Priority Data

Apr. 1, 2019 (KR) .................. 10-2019-0038084

(51) Int. Cl.
*H01L 31/048* (2014.01)
*B62D 25/06* (2006.01)
(Continued)

(52) U.S. Cl.
CPC ............ *H01L 31/048* (2013.01); *B62D 25/06* (2013.01); *H01L 31/0504* (2013.01); *H02S 20/30* (2014.12)

(58) Field of Classification Search
CPC ... H01L 31/048; H01L 31/0504; H01L 31/02; B62D 25/06; H02S 20/30; B32B 17/06; B32B 17/12; Y02E 10/50
See application file for complete search history.

(56) References Cited

U.S. PATENT DOCUMENTS 5,149,351 A * 9/1992 Yaba .................... B60J 7/04
257/E27.125
6,184,457 B1 * 2/2001 Tsuzuki .......... H01L 31/022433
136/244
(Continued)

FOREIGN PATENT DOCUMENTS

KR 10-2010-0133622 A 12/2010
KR 10-2013-0059965 A 6/2013
(Continued)

*Primary Examiner* — Devina Pillay
(74) *Attorney, Agent, or Firm* — Birch, Stewart, Kolasch & Birch, LLP

(57) ABSTRACT

A solar cell panel can include solar cell parts including a solar cell and a wiring member connected to the solar cell; a first cover member disposed at a front surface of the solar cell; a second cover member disposed at a rear surface of the solar cell; a sealing member disposed between the first cover member and the second cover member, the sealing member surrounding the solar cell parts; and one or more of a plurality of fixing members including at least one of a first fixing member and a second fixing member, in which the first fixing member is disposed at a rear surface of the first cover member and fixes at least part of one of the solar cell parts to the first cover member, and the second fixing member fixes the second cover member to the first cover member.

12 Claims, 12 Drawing Sheets

(51) Int. Cl.
*H01L 31/05* (2014.01)
*H02S 20/30* (2014.01)

(56) References Cited

U.S. PATENT DOCUMENTS

| | | | |
|---|---|---|---|
| 2008/0295880 A1 | 12/2008 | Skryabin et al. | |
| 2010/0065116 A1* | 3/2010 | Stancel | B32B 27/38 |
| | | | 136/256 |
| 2014/0224327 A1* | 8/2014 | Weigel | H01L 31/0322 |
| | | | 136/259 |
| 2018/0204966 A1* | 7/2018 | Inaba | H01L 31/0504 |

FOREIGN PATENT DOCUMENTS

| | | |
|---|---|---|
| KR | 2013-247308 A | 12/2013 |
| KR | 10-2014-0121920 A | 10/2014 |
| KR | 10-2019-0000520 A | 1/2019 |
| KR | 10-2019-0014880 A | 2/2019 |

* cited by examiner

SOLAR CELL PANEL AND METHOD FOR MANUFACTURING THE SAME

CROSS-REFERENCE TO RELATED APPLICATION

This application claims priority to and the benefit of Korean Patent Application No. 10-2019-0038084 filed in the Republic of Korea on Apr. 1, 2019, the entire contents of which are incorporated herein by reference.

BACKGROUND OF THE INVENTION

Field of the Invention

The present disclosure relates to a solar cell panel and a method for manufacturing the same, and more particularly to a solar cell panel with an improved structure and a method for manufacturing the same.

Description of the Related Art

A plurality of solar cells are connected in series or in parallel by an interconnector and manufactured in the form of a solar cell panel by a packaging process for protecting the plurality of solar cells. Recently, solar cell panels are increasingly being applied to houses, buildings, vehicles, and the like. In this instance, according to applied fields of the solar cell panels, characteristics that were not strictly required previously may be additionally or strictly required.

For example, since a related art solar cell panel for power generation was installed on the roof, etc., it was not required to have a good appearance. Further, because the solar cell panel for power generation had a flat plane shape, there was no great difficulty in maintaining a distance between solar cells. Even if a fixing member is used to maintain the distance between the solar cells, the solar cell panel with the flat plane shape was also less likely to encounter a problem, such as moisture penetration, due to the fixing member because the fixing member can be entirely covered by a sealing member.

On the other hand, when a solar cell panel is applied to houses, buildings, vehicles, etc., it is required to have a good appearance. If the solar cell panel is applied to the vehicle and has a curved shape, locations of various layers or members constituting the solar cell panel may be undesirably changed due to the curved shape. In order to prevent this, even if a fixing member is used, the fixing member should not be easily recognized from the outside, in order to not harm the appearance, and there should be no problems, such as moisture penetration in a portion in which the fixing member is positioned. Thus, a solar cell panel with a structure suitable for the vehicle or a curved shape is demanded.

In the related art, a fixing tape for fixing a solar cell and a sealing member was disclosed in Japanese Patent No. 4207456. The fixing tape fixes the solar cell and the sealing member, and thus has a difficulty in fixing a cover member with a curved shape, a plurality of solar cells with a curved shape, wiring member connected to them, etc. at their desired location. Further, the fixing tape performs only a role of fixing, and it is not considered at all whether the fixing tape is easily recognized in a final structure. Therefore, the fixing tape is not suitable for the solar cell panel applied to the vehicle where the appearance is important.

SUMMARY OF THE INVENTION

The present disclosure provides a solar cell panel with a good appearance and improved reliability, and a method for manufacturing the same.

More specifically, the present disclosure provides a solar cell panel and a method for manufacturing the same capable of having excellent alignment characteristics by fixing a solar cell and a wiring member at a desired location. In this instance, the present disclosure provides a solar cell panel and a method for manufacturing the same capable of preventing a problem, such as moisture penetration, while also having a good appearance.

In particular, the present disclosure provides a solar cell panel and a method for manufacturing the same capable of having a good appearance and excellent reliability even when being applied to a vehicle. Further, the present disclosure provides a solar cell panel and a method for manufacturing the same capable of having a good appearance and excellent reliability even when a curved shape is used.

In one aspect, there is provided a solar cell panel including a solar cell part including a solar cell; a sealing member surrounding the solar cell part; a first cover member positioned on the sealing member and at a front surface of the solar cell; and a second cover member positioned on the sealing member and at a rear surface of the solar cell. In this instance, the solar cell panel can further include a first fixing member that is positioned at a rear surface of the first cover member and fixes the solar cell part and the first cover member. For example, the solar cell part can further include a wiring member connected to the solar cell, and the first fixing member can fix the wiring member and the first cover member. Alternatively, the solar cell panel can further include a second fixing member that fixes the second cover member and the first cover member.

The fixing member can be a melting type.

The fixing member can take the form of a tape including a base member and an adhesive layer that is formed on one surface of the base member and is attached to the first cover member and the solar cell part or the second cover member.

The first cover member can have a larger area than the second cover member or the sealing member. The first or second fixing member can include an inside portion overlapping the sealing member or the second cover member and an outside portion that extends from the inside portion and is fixed to the rear surface of the first cover member.

A width of the fixing member can be less than a length of the fixing member in an extension direction of the fixing member.

The fixing member can include a different material from the sealing member, and a thickness of the fixing member can be less than a thickness of the sealing member.

The wiring member can include a bus ribbon, and the first fixing member can fix the bus ribbon and the first cover member at a rear surface of the bus ribbon and the rear surface of the first cover member.

The first fixing member can be positioned not to overlap the solar cell.

The solar cell can include a plurality of solar cells that forms a solar cell string extended in one direction. The fixing member can include a first fixing member that fixes the first cover member and the solar cell part at the rear surface of the first cover member and a rear surface of the solar cell part, and a second fixing member that fixes the first cover member and the second cover member at the rear surface of the first cover member and a rear surface of the second cover member. The first fixing member and the second fixing member can be positioned side by side in a portion adjacent to an edge of the solar cell panel in a direction parallel to an extension direction of the solar cell string.

The wiring member can include a bus ribbon that is positioned to overlap at least a portion of the solar cell, and the solar cell panel can further includes an insulating member that is positioned between the solar cell and the bus ribbon to insulate between the solar cell and the bus ribbon. The fixing member can further include a third fixing member that fixes the bus ribbon and the insulating member at a rear surface of the bus ribbon and a rear surface of the insulating member.

The solar cell panel can be used as a roof of a vehicle. The solar cell panel can have a curved shape. The first cover member can be made of a glass substrate with a curved shape.

In another aspect, there is provided a method for manufacturing a solar cell panel comprising a stacking step. The stacking step can use a solar cell part that is positioned at a rear surface of a first cover member and includes a solar cell, and a first fixing member for fixing the first cover member. For example, the solar cell part can further include a wiring member connected to the solar cell, and the first fixing member can fix the wiring member and the first cover member. Alternatively, the stacking step can use a second fixing member that fixes the second cover member and the first cover member.

More specifically, the stacking step can include stacking in order the first cover member, a first sealing member, the solar cell part including the solar cell and the wiring member, a second sealing member, and a second cover member to form a stack structure. In this instance, at least one of the first fixing member and the second fixing member can be used.

Subsequent to the stacking step, the method can further include a lamination step of applying heat and pressure to the stack structure and laminating the stack structure.

The fixing member can be a melting type in which the fixing member melts in the lamination step.

The fixing member can include a base member and an adhesive layer on one surface of the base member. The fixing member can be fixed so that the adhesive layer is attached to the first cover member and the solar cell part or the second cover member.

The stacking step can include a process of placing the first sealing member and the solar cell part on the first cover member; a process of attaching the first fixing member to fix a rear surface of the solar cell part and the rear surface of the first cover member; a process of placing the second sealing member and the second cover member on the solar cell part; and a process of attaching the second fixing member to fix a rear surface of the second cover member and the rear surface of the first cover member.

The wiring member can include a bus ribbon, and the first fixing member can fix the bus ribbon and the first cover member at a rear surface of the bus ribbon and the rear surface of the first cover member.

The wiring member can include a bus ribbon. The method can further includes, between the process of attaching the first fixing member and the process of placing the second sealing member and the second cover member, a process of placing an insulating member between the solar cell and the bus ribbon to insulate between the solar cell and the bus ribbon; and a process of attaching a third fixing member that fixes the bus ribbon and the insulating member at a rear surface of the bus ribbon and a rear surface of the insulating member.

The first cover member can be made of a glass substrate with a curved shape.

The solar cell panel according to embodiments of the present disclosure can stably fix locations of the first cover member, the solar cell part, and the second cover member by the fixing member. In this instance, if the fixing member of the melting type is used, the fixing member can be prevented from being easily recognized, and the problem such as moisture penetration can be prevented because the sealing member surrounds the fixing member without gaps. Hence, the appearance and the reliability of the solar cell panel can be improved. In particular, embodiments can improve the appearance and the reliability of the solar cell panel that is applied to a vehicle or has the curved shape.

The method for manufacturing the solar cell panel according to embodiments of the present disclosure can improve the appearance and the reliability of the solar cell panel by a simple process using the fixing member. In particular, embodiments can improve the appearance and the reliability of the solar cell panel by applying to the manufacture of the solar cell panel that is applied to a vehicle or has the curved shape.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
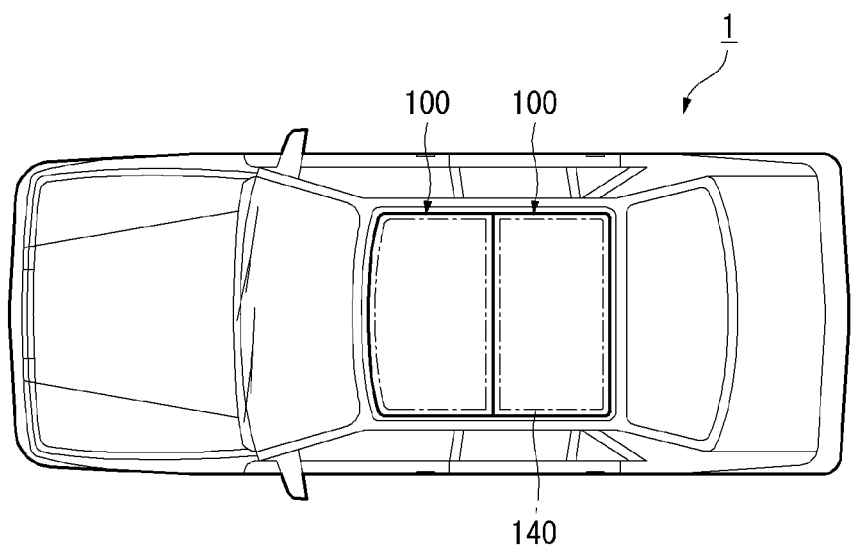
FIG. 1 is a plan view illustrating an example where a solar cell panel according to an embodiment of the present disclosure is applied to a roof of a vehicle.
Figure 1:
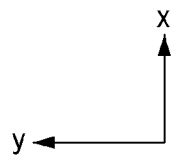

Reference will now be made in detail to embodiments of the present disclosure, examples of which are illustrated in the accompanying drawings. This disclosure may, however, be embodied in many different forms and should not be construed as limited to the embodiments set forth herein.

In the drawings, illustration of parts unrelated to embodiments of the present disclosure is omitted for clarity and simplicity of description. The same reference numerals designate the same or very similar elements throughout the present disclosure. In the drawings, thickness, width, etc. of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also between them. Accordingly, when an element such as a layer, film, region, or plate is disposed "directly on" another element, this means that there is no intervening element between the elements.

Hereinafter, a solar cell panel and a method for manufacturing the same according to embodiments of the present disclosure will be described in detail with reference to the accompanying drawings.

FIG. 1 is a plan view illustrating an example where a solar cell panel according to an embodiment of the present disclosure is applied to a roof of a vehicle.

As illustrated in FIG. 1, a solar cell panel 100 according to the present embodiment can be applied to a roof of a vehicle 1. The solar cell panel 100 can have a curved shape suitable for a shape of the roof of the vehicle 1. FIG. 1 illustrates two solar cell panels 100 are mounted on the roof of the vehicle 1, by way of example. In this situation, one solar cell panel 100 can be fixed and installed on the roof of the vehicle 1, and the other solar cell panel 100 can be movably installed and can open and close the roof (e.g., part of a sun or moon roof). Hence, the roof of the vehicle 1 can have an opening that can communicate the interior and the exterior of the vehicle 1. However, the present disclosure is not limited thereto. For example, the solar cell panel 100 can be fixed and installed on the roof of the vehicle 1, and one or two or more solar cell panels 100 can be positioned on the vehicle 1. The number, the arrangement, the installation type, etc. of the solar cell panels 100 installed on the roof of the vehicle 1 can be variously changed.

Various known structures can be applied to an installation structure of the solar cell panel 100 that is installed on the roof of the vehicle 1 or installed on a frame, etc. of the vehicle 1.

The solar cell panel 100 with the above-described curved shape is described in more detail with reference to FIGS. 2 to 5.

Figure 2:
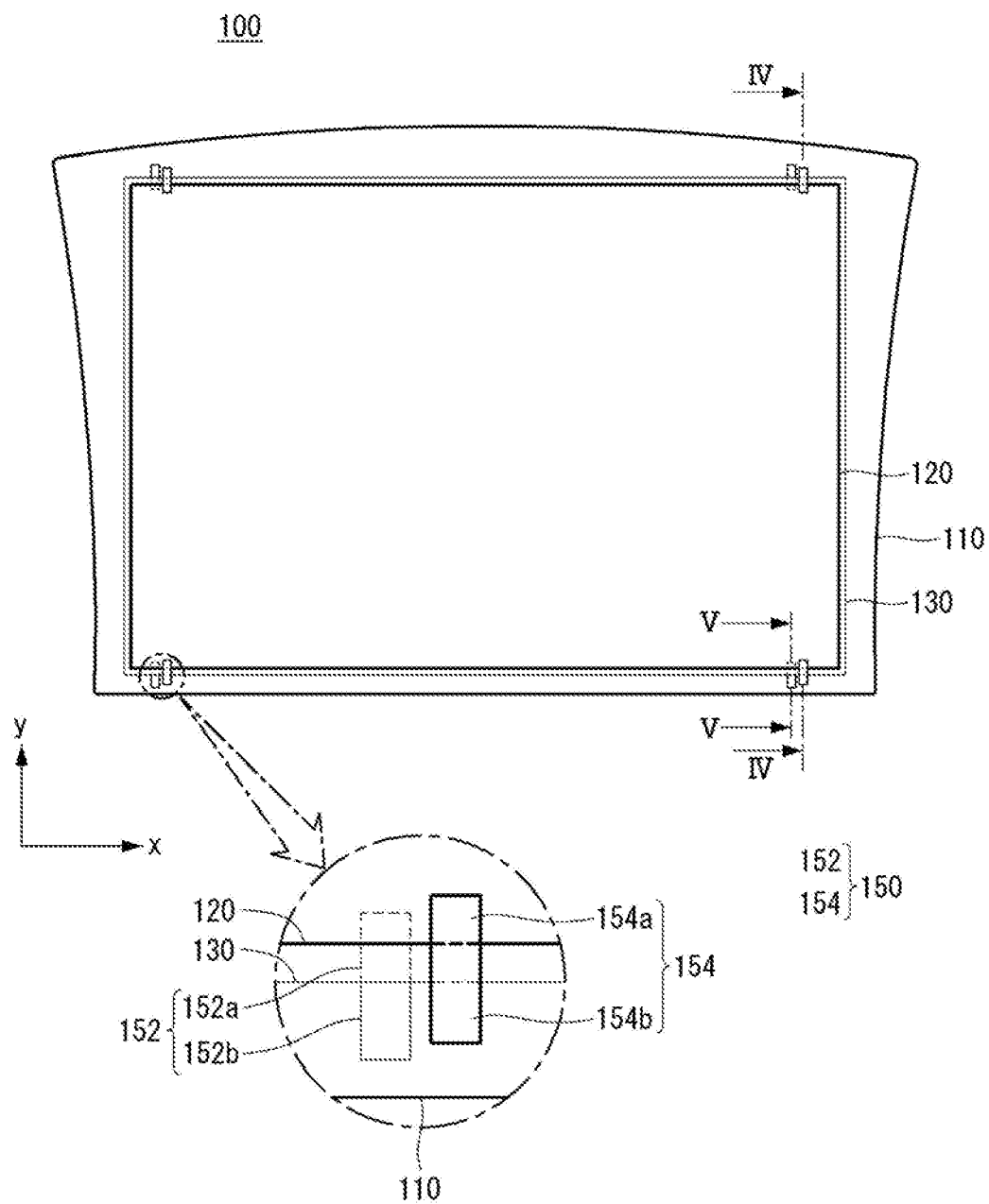
FIG. 2 is a rear plan view illustrating a solar cell panel according to an embodiment of the present disclosure.
Figure 3:
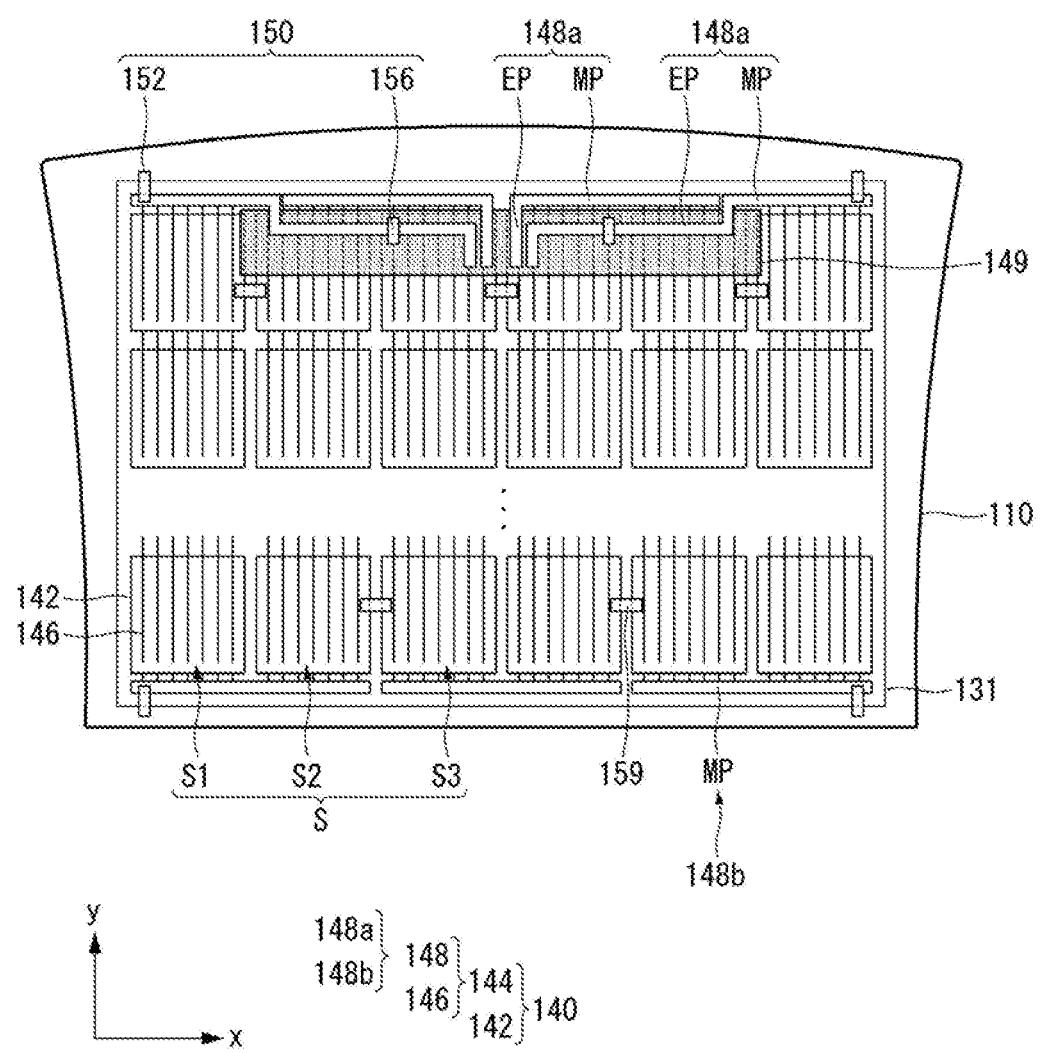
FIG. 3 is a rear plan view of the solar cell panel of FIG. 2, according to an embodiment of the present, in which a second sealing member, a second cover member, and a second fixing member are not illustrated (e.g., because these elements are sealed inside).
Figure 4:
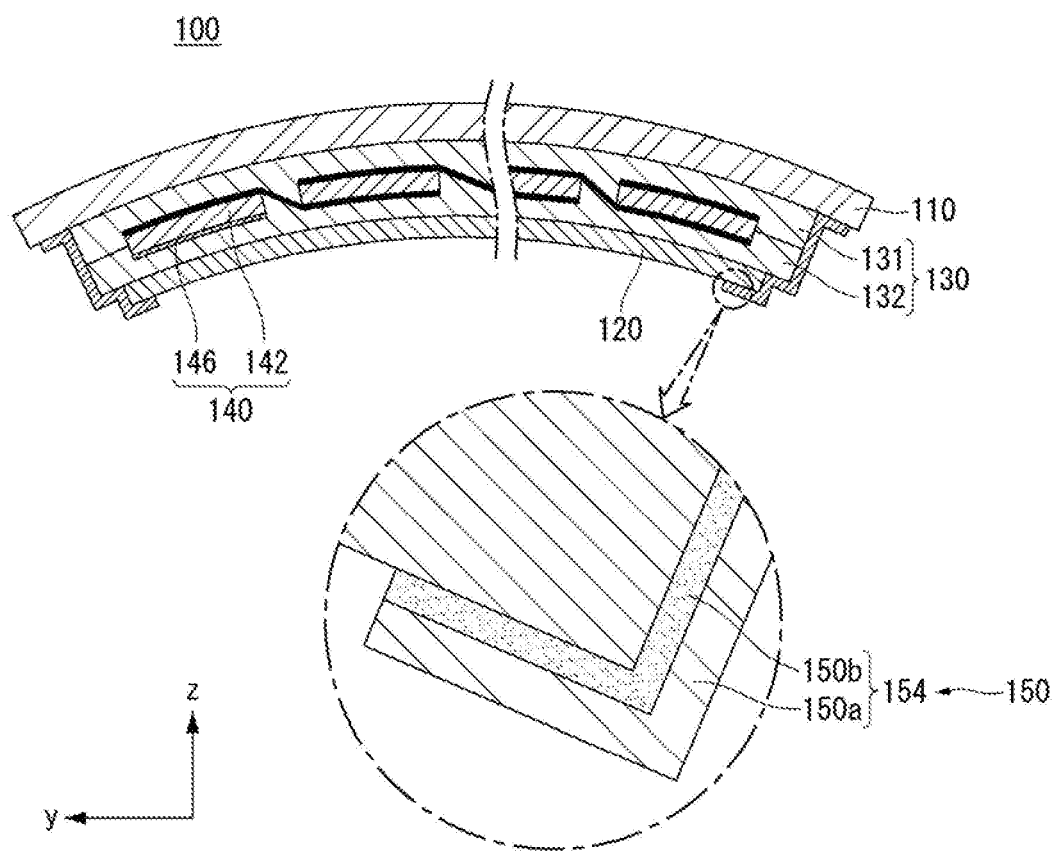
FIG. 4 is a cross-sectional view taken along line IV-IV of FIG. 2, which includes a view of the second fixing member 154, according to an embodiment of the present.
Figure 5:
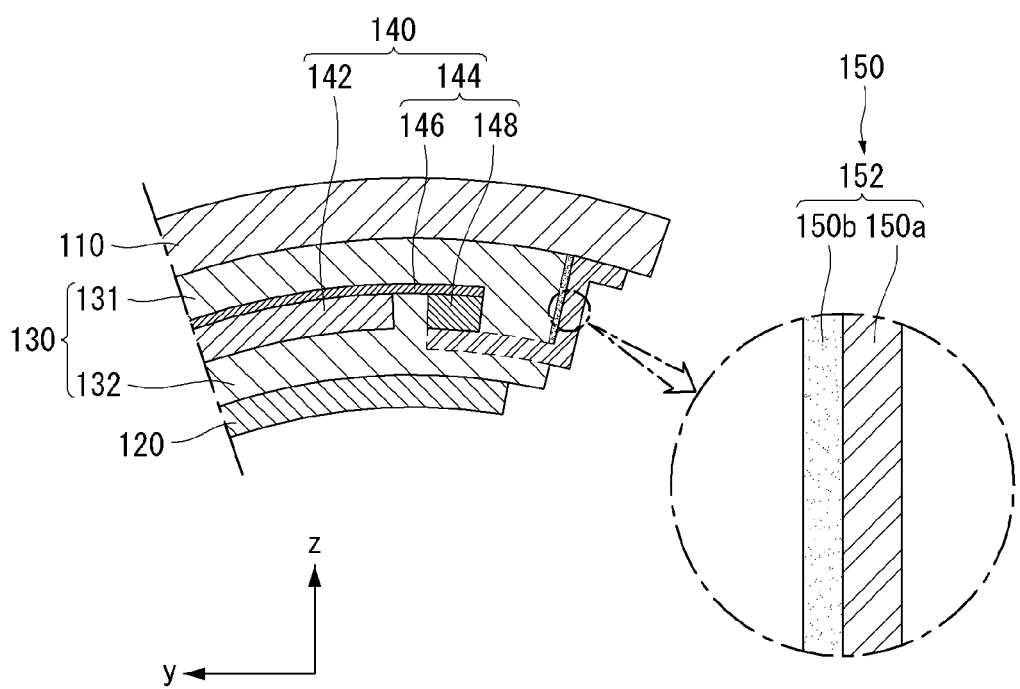
FIG. 5 is a cross-sectional view taken along line V-V of FIG. 2, which includes a view of the first fixing member 152, according to an embodiment of the present.

FIG. 2 is a rear plan view illustrating a solar cell panel according to an embodiment of the present disclosure. FIG. 3 is a rear plan view of the solar cell panel of FIG. 2, in which a second sealing member, a second cover member, and a second fixing member are not illustrated (e.g., because these elements are sealed between the layers shown in this view). FIG. 4 is a cross-sectional view taken along line IV-IV of FIG. 2. FIG. 5 is a cross-sectional view taken along line V-V of FIG. 2. For the simple illustration, a bus ribbon is omitted in FIG. 4.

With reference to FIGS. 2 to 5, the solar cell panel 100 according to the present embodiment includes a plurality of solar cell parts 140 each including a solar cell 142 and a wiring member 144 connected to the solar cell 142, a sealing member 130 that surrounds and seals the plurality of solar cell parts 140, a first cover member 110 that is positioned on the sealing member 130 and on front surfaces of the solar cells 142, and a second cover member 120 that is positioned on the sealing member 130 and on rear surfaces of the solar cells 142. In this instance, the present embodiment includes a fixing member 150 that is positioned at a rear surface of the first cover member 110 and fixes at least one of the solar cell part 140 and the second cover member 120 to the first cover member 110. This is described in more detail below.

The solar cell 142 can include a photoelectric conversion unit that converts solar energy into electric energy, and electrodes that are electrically connected to the photoelectric conversion unit to collect and transfer a current. The plurality of solar cells 142 can be electrically connected in series, parallel, or series-parallel by the wiring member 144. In the present embodiment, for example, the solar cell 142 can be a silicon solar cell including a single crystal or polycrystalline silicon substrate and a conductive region made of a semiconductor material (e.g., silicon) at or on the single crystal or polycrystalline silicon substrate. The silicon solar cell has excellent electrical characteristics and efficiency, but the present disclosure is not limiter thereto. For example, the present disclosure can use solar cells of various structures, such as an amorphous solar cell, a thin film solar cell, a dye-sensitized solar cell, a tandem solar cell, a compound semiconductor solar cell, as the solar cell 142. The present embodiment illustrated and described that the solar cell panel includes the plurality of solar cells 142, but the solar cell panel can include only one solar cell 142.

The wiring member 144 can include an interconnector 146 connecting the plurality of solar cells 142 in a first direction (e.g., a y-axis direction in the drawing). In this instance, the interconnector 146 can electrically connect two adjacent solar cells 142 among the plurality of solar cells 142 and form a solar cell string S that forms one row in the first direction by repeating the connection of two adjacent solar cells 142. The interconnector 146 can have various shapes and structures including a wire, a wiring member, a ribbon, etc., and the number, the arrangement, etc. of interconnectors 146 can be variously changed.

FIGS. 3 to 5 illustrate that the interconnector 146 has a structure extending from a first electrode on a front surface of one solar cell 142 to a second electrode on a rear surface of the one solar cell 142 adjacent to the first electrode, by way of example. For example, the solar cell 142 can have a bifacial structure in which light is incident on both surfaces of the solar cell 142 through a predetermined pattern of the first and second electrodes. However, the present disclosure is not limiter thereto. For example, the solar cell 142 can have a structure in which light is not incident on the rear surface of the solar cell 142 because the second electrode is formed on the entire rear surface of the solar cell 142. Further, the solar cell 142 can have a rear electrode structure in which both the first and second electrodes are positioned on the rear surface of the solar cell 142, and the interconnector 146 can connect adjacent solar cells 142 at the rear surfaces of the adjacent solar cells 142. Other various modifications can be used.

The wiring member 144 can include a bus ribbon 148 connecting both ends of the solar cell string S. The bus ribbon 148 can connect the adjacent solar cell strings S, or connect the solar cell string S to a terminal box such as a junction box preventing the reverse of the current.

The bus ribbon 148 can be disposed in an extension direction of the solar cell string S or a second direction (e.g., an x-axis direction in the drawing) crossing the first direction at an end of the solar cell string S. For example, the bus ribbon 148 can connect in series the plurality of solar cell string S by alternately connecting the interconnectors 146 at both ends of the solar cell string S.

In the present embodiment, a first bus ribbon 148a positioned on one end (e.g., upper side in FIG. 3) of the first direction includes a main connection portion MP connected to the solar cell string S and an extension portion EP that is extended to be connected to the terminal box such as the junction box, and a second bus ribbon 148b positioned on the other end (e.g., lower side in FIG. 3) of the first direction includes a main connection portion MP connected to the solar cell string S. The first bus ribbon 148a and the second bus ribbon 148b can be alternately connected to the solar cell strings S. For example, the first bus ribbon 148a can be connected to one end of a first solar cell string S1, the second bus ribbon 148b can be connected to the first solar cell string S1 and a second solar cell string S2 at the other end, and other first bus ribbon 148a can be connected to the second solar cell string S2 and a third solar cell string S3 at the one end. Such a connection is repeated and thus can connect the plurality of solar cell strings S in series.

In this instance, the extension portion EP of each first bus ribbon 148a can have a shape capable of minimizing an area of the bus ribbon 148. For example, the extension portion EP of the first bus ribbon 148a can bend from an inside end of the main connection portion MP to the lower side, then extend along the second direction toward a location of the terminal box, again bend, and extends along the first direction. Hence, the extension portions EP of the plurality of first bus ribbons 148a can be prevented from undesirably overlapping or being short-circuited, and an overlap area of the plurality of first bus ribbons 148a and the solar cell 142 can also be minimized.

In such a structure, at least a portion of the first bus ribbon 148a can be positioned to overlap at least a portion of the solar cell 142 (e.g., a portion of the solar cell 142 positioned at one end) positioned on one side (e.g., upper side) of the solar cell panel 100 at the rear surface of the solar cell 142. If the first bus ribbon 148a is positioned to overlap the rear surface of the solar cell 142 as described above, the first bus ribbon 148a can minimize an area recognized at the front surface and minimize an area that is not involved in the photoelectric conversion of the solar cell panel 100.

An insulating member 149 can be positioned between the solar cell string S and the first bus ribbon 148a in an overlap portion between the solar cell string S and the first bus ribbon 148a. The insulating member 149 can prevent the unwanted electrical connection (e.g., a short circuit) between the solar cell string S and the first bus ribbon 148a.

The insulating member 149 can be formed to correspond to the solar cell 142 positioned on each side and can have a shape extending in the second direction (e.g., x-axis direction in the drawing) so that it is positioned over the plurality of solar cell strings S. The insulating member 149 can include various known insulating materials (e.g., resin) and can be formed in the various forms of a film, a sheet, etc. The insulating member 149 can include various materials and have various characteristics. For example, at least a portion of the insulating member 149 can include the same material as at least a portion of the sealing member 130. Hence, the insulating member 149 has characteristics equal or similar to the sealing member 130 and can improve the stability. However, the present disclosure is not limited thereto. Further, the insulating member 149 can have a color equal or similar to the second cover member 120. However, the present disclosure is not limited thereto. For example, the insulating member 149 can be transparent or can have a different color from the second cover member 120. Other modifications can be used.

In the present embodiment, the material, the shape, the connection structure, etc. of the bus ribbon 148 and the material, the shape, etc. of the insulating member 149 can be variously modified, and the present disclosure is not limited thereto.

The sealing member 130 can include a first sealing member 131 on a front surface of the solar cell part 140 and a second sealing member 132 on a rear surface of the solar cell part 140. The first sealing member 131 and the second sealing member 132 prevent moisture and oxygen from entering and chemically combine the respective components of the solar cell panel 100. The first and second sealing members 131 and 132 can be made of an insulating material with transparency and adhesiveness. For example, the first sealing member 131 and the second sealing member 132 can use an ethylene-vinyl acetate copolymer resin (EVA), polyvinyl butyral, a silicon resin, an ester-based resin, an olefin-based resin, or the like. The second cover member 120, the second sealing member 132, the solar cell part 140, the first sealing member 131, and the first cover member 110 can be integrated by a lamination process, etc. using the first and second sealing members 131 and 132 to form the solar cell panel 100.

For reference, a boundary between the first and second sealing members 131 and 132 is illustrated in the figures for convenience of explanation. However, it can be difficult to actually recognize the boundary between the first and second sealing members 131 and 132 because the first and second sealing members 131 and 132 are integrated during the lamination process.

The first cover member 110 is positioned on the first sealing member 131 to form a front surface of the solar cell panel 100, and the second cover member 120 is positioned on the second sealing member 132 to form a rear surface of the solar cell panel 100. Each of the first cover member 110 and the second cover member 120 can be made of an insulating material capable of protecting the solar cells 142 from external shock, moisture, ultraviolet rays, and the like. The first cover member 110 can be made of a light transmitting material capable of transmitting light, and the second cover member 120 can be made of a sheet formed of a light transmitting material, a non-light transmitting material, or a reflective material, etc. For example, the first cover member 110 can be made of a glass substrate, etc., and the second cover member 120 can be made of a sheet including a resin. For example, the second cover member 120 can have a Tedlar/PET/Tedlar (TPT) type, or include a polyvinylidene fluoride (PVDF) resin layer on at least one surface of a base film (e.g., polyethylene terephthalate (PET)).

If the second cover member 120 is formed of a sheet as described above, the solar cell panel 100 can be suitable to be applied to the vehicle 1 by reducing the weight of the solar cell panel 100. For example, in the present embodiment, the second cover member 120 can have a predetermined color and thus can be made of a sheet not transmitting light. For example, white, black, etc. sheets can be used as the second cover member 120. This is configured to consider an appearance, etc. of the vehicle 1, but the present disclosure is not limited thereto. For example, the second cover member 120 can include a light transmitting material (e.g., a transparent material) capable of transmitting light. In this instance, if the solar cell 142 has a bifacial structure, the solar cell panel 100 has a bifacial structure and thus can use all light incident on both surface of the solar cell panel 100.

However, the present disclosure is not limited thereto, and other modifications can be used. For example, the first and second sealing members 131 and 132, the first cover member 110, or the second cover member 120 can include various materials other than those described above, and can have various shapes. For example, the first cover member 110 or the second cover member 120 can have various shapes (e.g., a substrate, a film, a sheet, etc.) or materials.

In the present embodiment, the first cover member 110 can have a larger area than the sealing member 130 and the second cover member 120. Hence, an outer portion of the first cover member 110 can be stably fixed to a body or a frame, etc. of the vehicle 1. FIG. 3 illustrates that the sealing member 130 has a larger area than the second cover member 120, by way of example. The present embodiment allows the sealing member 130 to have a larger area than the second cover member 120 by a pressure applied in the lamination process, and thus can secure a predetermined process margin and stably secure sealing characteristics between the first cover member 110 and the second cover member 120. In the solar cell panel used for the power generation, if the sealing member has the larger area than the first and/or second cover members, a trimming process is performed to remove a portion exposed to the outside of the first and/or second cover members. However, in the present embodiment, since an outer portion of the solar cell panel 100 is fixed to the body or the frame, etc. of the vehicle 1, a separate trimming process does not need to be performed. However, the present disclosure is not limited thereto. For example, the sealing member 130 can have the same area as the second cover member 120 or can have a smaller area than the second cover member 120. Other modifications can be used.

In this instance, in the present embodiment, the solar cell panel 100 can have a curved shape. More specifically, the lamination process can be performed in a state, in which the first sealing member 131, the solar cell part 140, the second sealing member 132, and the second cover member 120 (e.g., the second cover member 120 made of a sheet including a resin) are positioned on the first cover member 110 (e.g., the first cover member 110 made of a glass substrate with a desired curved shape) with a desired curved shape, to form the solar cell panel 100 with the curved shape. In the present disclosure, having the curved shape can include all of having predetermined curvature or partially or entirely including a round portion.

If the solar cell panel 100 or the first cover member 110 has the curved shape as described above, a location of the solar cell part 140 with respect to the first cover member 110 and a location of the second cover member 120 with respect to the first cover member 110 can be undesirably changed during the lamination process. Hence, the present embodiment includes a fixing member 150 fixing at least one of the solar cell part 140 and the second cover member 120 to the first cover member 110.

More specifically, the fixing member 150 can include at least one of a first fixing member 152 and a second fixing member 154. The first fixing member 152 can fix the solar cell part 140 to the first cover member 110 at the rear surface of the first cover member 110 and the rear surface of the solar cell part 140. The second fixing member 154 can fix the second cover member 120 to the first cover member 110 at the rear surface of the first cover member 110 and a rear surface of the second cover member 120. In particular, the fixing member 150 can include the first fixing member 152, and this is because the fixing of the solar cell part 140 to the first cover member 110 can greatly affect the reliability and the appearance, etc. of the solar cell panel 100. However, the present disclosure is not limited thereto.

The first fixing member 152 can lead from a rear surface of a portion of the solar cell part 140 to the outside of the sealing member 130 and extend to the rear surface of the first cover member 110. For example, the first fixing member 152 can fix the bus ribbon 148 to the first cover member 110 at a rear surface of the bus ribbon 148 and the rear surface of the first cover member 110. More specifically, the first fixing member 152 can lead from the rear surface of the bus ribbon 148 to the outside of the sealing member 130 via the inside of the sealing member 130 (e.g., more specifically, between the first sealing member 131 and the second sealing member 132) and extend along at least the side of the first sealing member 131, and then can be extended to reach the rear surface of the first cover member 110. As described above, when the area of the sealing member 130 is larger than the area of the second cover member 120, the first fixing member 152 can be extended on the rear surface and the side of the first sealing member 131 (e.g., the fixing member 152 can bend around a corner or outer edge of the first sealing member 131).

In this instance, the first fixing member 152 can be positioned only on the rear surface of the bus ribbon 148 and positioned not to overlap the solar cell 142 (e.g., the first fixing member 152 can terminate before reaching near the solar cell 142). Hence, the present embodiment can minimize the recognition of the first fixing member 152 at the front by minimizing the size of the first fixing member 152 (e.g., in this way, the fixing member can be better hidden from view, improving appearance).

The solar cell part 140 can be stably fixed at a fixed location of the first cover member 110 by the first fixing member 152. Hence, even if the solar cell part 140 is positioned on the first cover member 110 of the curved shape, the solar cell part 140 can be stably fixed at a desired location. More specifically, the solar cell 142 and the wiring member 144 constituting the solar cell part 140 can be stably fixed at a desired location.

The second fixing member 154 can extend from the rear surface of the second cover member 120 to the rear surface of the first cover member 110 and fix the second cover member 120 to the first cover member 110. More specifically, the second fixing member 154 can extend from the rear surface of the second cover member 120 along at least the side of the second sealing member 132 and the side of the first sealing member 131 and then may be extended to reach the rear surface of the first cover member 110 (e.g., the second fixing member 154 can have stepped portions, such as following contours of the various layers, and can contact a back of the second cover member 120, back and side portions of sealing member 130 and a back portion of the first cove member 110, thus helping to secure the various members together and fix them in place). As described above, when the area of the sealing member 130 is larger than the area of the second cover member 120, the second fixing member 154 can be extended on the rear surface and the side of the second sealing member 132 and the side of the first sealing member 131.

The first cover member 110 can be stably fixed at a fixed location of the second cover member 120 by the second fixing member 154. Hence, even if the second cover member 120 is positioned on the first cover member 110 of the curved shape, the second cover member 120 can be stably fixed at a desired location.

For example, in the present embodiment, the fixing member 150 individually includes both the first fixing member 152 and the second fixing member 154, and thus the first cover member 110, the solar cell part 140, and the second cover member 120 can be stably fixed at a desired location. Hence, the first cover member 110, the solar cell part 140, and the second cover member 120, that constitute the solar cell panel 100 and have to be arranged at a desired location, can be entirely fixed stably.

The first fixing member 152 can include a first inside portion 152a positioned inside the sealing member 130 and a first outside portion 152b that is extended to the outside of the sealing member 130 and is fixed to the rear surface of the first cover member 110. The second fixing member 154 can include a second inside portion 154a positioned to overlap the second cover member 120 and a second outside portion 154b that is extended to the outside of the second cover member 120 and is fixed to the rear surface of the first cover member 110. As described above, when the solar cell part 140 and the first cover member 110 are fixed to the first cover member 110 made of the glass substrate using the first and second fixing members 152 and 154, the fixing stability can be further improved.

Since the first inside portion 152a is positioned inside the sealing member 130 (e.g., first inside portion 152a of the first fixing member 152 can be fitted between the first and second sealing members 131 and 132), a boundary between the sealing member 130 and the first inside portion 152a may not be clearly recognized if the first inside portion 152a is a melting type as described later. However, even in this situation, since at least a portion of the first fixing member 152 includes a different material from the sealing member 130, it can be checked whether the fixing member 150 has been used through the component analysis, etc. Alternatively, even if the first fixing member 152 positioned inside the sealing member 130 is not easily recognized by the naked eye after the lamination process, it can be checked whether the fixing member 150 has been used inside the sealing member 130 through a microscope, etc. A portion positioned on the rear surface of the first cover member 110 at the first outside portion 152b, the second fixing member 154, etc. each maintain its shape and can be recognized by the naked eye, but they are positioned to be covered by the body or the frame of the vehicle 1 and thus do not harm the appearance of the vehicle 1.

In the present embodiment, the first and/or second fixing members 152 and 154 (hereinafter, simply referred to as the fixing member 150) have the adhesive characteristics and are attached to the solar cell part 140 and/or the second cover member 120 and the first cover member 110, and thus can fix them. For example, the fixing member 150 can fix the rear surfaces of the first cover member 110, the solar cell part 140 and/or the second cover member 120 so that they do not move during the lamination process. In particular, if the first cover member 110 of the curved shape is used, the fixing member 150 is used to prevent the unwanted movement of the solar cell part 140 and/or the second cover member 120 that may occur during the lamination process.

The fixing member 150 can have various materials, structures, forms, etc. with adhesive properties. For example, the fixing member 150 takes the form of an insulating adhesive portion (e.g., an insulating adhesive tape) and is easily attached at a desired location, thereby stably fixing the solar cell part 140 and/or the second cover member 120 to the first cover member 110.

In this instance, the fixing member 150 can be formed as an insulating adhesive portion of a melting type. That is, the fixing member 150 can include a melting insulating adhesive material. The fixing member 150 can have a melting temperature lower than a temperature of the lamination process and can melt during the lamination process. Hence, the fixing member 150 can be closely attached to the first cover member 110, the solar cell part 140 and/or the second cover member 120. In this instance, the fixing member 150 can be closely attached to at least a portion of the side of the first and/or second sealing members 131 and 132. Hence, an air trap can be prevented from being formed between the first cover member 110, the solar cell part 140, the second cover member 120, the first and/or second sealing members 131 and 132, and the fixing member 150. Even if the fixing member 150 (e.g., the first fixing member 152) led to the outside of the sealing member 130 is used, the fixing member 150 is entirely surrounded by the sealing member 130 in a formation portion of the sealing member 130. Therefore, the problem of moisture penetration can be prevented. Hence, the high temperature and high humidity reliability of the solar cell panel 100 can be improved. On the other hand, if a fixing member of a non-melting type is used, some separation can occur between the sealing member 130 and the fixing member, and moisture can penetrate through the separation. Hence, the high temperature and high humidity reliability of the solar cell panel can be reduced.

In the present embodiment, the fixing member 150 of the melting type can be used and can melt together with the sealing member 130 during the lamination process. Therefore, a boundary between the fixing member 150 (more specifically, the first inside portion 152a of the first fixing member 152) positioned inside the sealing member 130 and the fixing member 150 is not easily found when viewed from the front of the solar cell panel 100. Hence, the fixing member 150 is not easily recognized when viewed from the outside, and can maintain the good appearance of the solar cell panel 100. In particular, even if the solar cell panel 100 is applied to the vehicle 1 where the appearance is important, the good appearance of the vehicle 1 can be maintained.

For example, the fixing member 150 can take the form of a tape including a base member 150a and an adhesive layer 150b on the surface of the base member 150a. In the lamination process, the fixing member 150 can be attached so that the adhesive layer 150b contacts the rear surface of the first cover member 110, the solar cell part 140, and/or the rear surface of the second cover member 120. Hence, a portion positioned outside the sealing member 130, e.g., the first outside portion 152b of the first fixing member 152 and the second fixing member 154 can be positioned in a state in which the adhesive layer 150b contacts the rear surface of the first cover member 110, at least the side of the sealing member 130, and the rear surface of the second cover member 120.

The base member 150a can be made of a material that can melt during the lamination process because a melting temperature is lower than the temperature of the lamination process. For example, the base member 150a can be made of polyolefin material, and/or made of a material that has a melting temperature of 170° C. or less and can melt during the lamination process. The adhesive layer 150b has adhesive properties and may be made of a material that can melt during the lamination process because a melting temperature is lower than the temperature of the lamination process. For example, the adhesive layer 150b may include acrylic, silicon, or an epoxy-based adhesive material, and/or may be made of an adhesive material that has a melting temperature of 170° C. or less and can melt during the lamination process. In addition, the fixing member 150, or the base member 150a and the adhesive layer 150b may be made of a transparent material that is transparent after the lamination process and is difficult to recognize from the outside. However, the present disclosure is not limited thereto. The fixing member 150, or the base member 150a and the adhesive layer 150b can have a specific color or texture, etc., if necessary or desired.

The fact that the base member 150a, the adhesive layer 150b, or the material forming it melt during the lamination process can mean that they are softened in a state of a paste with a viscosity and are again hardened after the lamination process, not that they are completely burned.

Since the fixing member 150 or the material forming it is softened in the lamination process, a portion of the fixing member 150 (more specifically, the first inside portion 152a of the first fixing member 152) positioned inside the sealing member 130 has been softened and then hardened together with the sealing member 130. Therefore, the sealing member 130 and the portion of the fixing member 150 positioned inside the sealing member 130 can be hardened without a gap between them. Because the portion of the fixing member 150 positioned inside the sealing member 130 is entirely sealed and surrounded by the sealing member 130, a moisture penetration path can be prevented from being formed.

A thickness of the fixing member 150 can be less than a thickness of the sealing member 130. More specifically, the thickness of the fixing member 150 can be less than an entire thickness of the sealing member 130 (a thickness between the first cover member 110 and the second cover member 120). The thickness of the fixing member 150 can be less than each of a thickness of the first sealing member 131 (a thickness between the first cover member 110 and the solar cell part 140) and a thickness of the second sealing member 132 (a thickness between the solar cell part 140 and the second cover member 120). Hence, even if the fixing member 150 (e.g., the first fixing member 152) is positioned inside the sealing member 130 (e.g., between layers 131 and 132), the excellent structural stability can be maintained. For example, the thickness of the fixing member 150 can be approximately 1 μm to 200 μm (e.g., approximately 5 μm to 100 μm). However, the present disclosure is not limited thereto, and other thicknesses can be used for the fixing member 150.

A width of the fixing member 150 in an extension direction of the fixing member 150 (a direction extending from the solar cell part 140 and/or the second cover member 120 to the first cover member 110) can be greater than a width of the fixing member 150 in a direction crossing the extension direction. This can achieve the solid fixing by relatively lengthening the extension direction of the fixing member 150 for the fixing, and can reduce the material cost of the fixing member 150 and efficiently prevent the fixing member 150 from being recognized from outside by decreasing the width of the fixing member 150. However, the present disclosure is not limited thereto, and other shapes can be used for the fixing member 150.

In the present embodiment, the first fixing member 152 and the second fixing member 154 can be extended in a direction parallel to the solar cell string S. For example, the first fixing member 152 and the second fixing member 154 can be positioned to be parallel to each other in an adjacent portion around an edge of the solar cell panel 100. Here, the adjacent portion around the edge can mean a portion in which a distance between the adjacent portion and the edge is shorter than a distance between the adjacent portion and the center.

If the first fixing member 152 and/or the second fixing member 154 are positioned in the direction parallel to the solar cell string S as described above, a flow path parallel to the solar cell string S can be formed at both ends of the second direction crossing the solar cell string S. Since bubbles can stably flow to the outside through the flow path in the lamination process, the present disclosure can prevent a phenomenon in which bubbles remains at both ends in the second direction crossing the solar cell string S. On the other hand, if the first fixing member 152 and/or the second fixing member 154 are led in the direction crossing the solar cell string S, a flow path parallel to the solar cell string S is blocked at both ends of the direction crossing the solar cell string S, and the likelihood of bubbles remaining may increase. However, the present disclosure is not limited thereto, and the first fixing member 152 and/or the second fixing member 154 can be led to the outside in the direction crossing the solar cell string S. Other modifications can be used.

Figure 6:
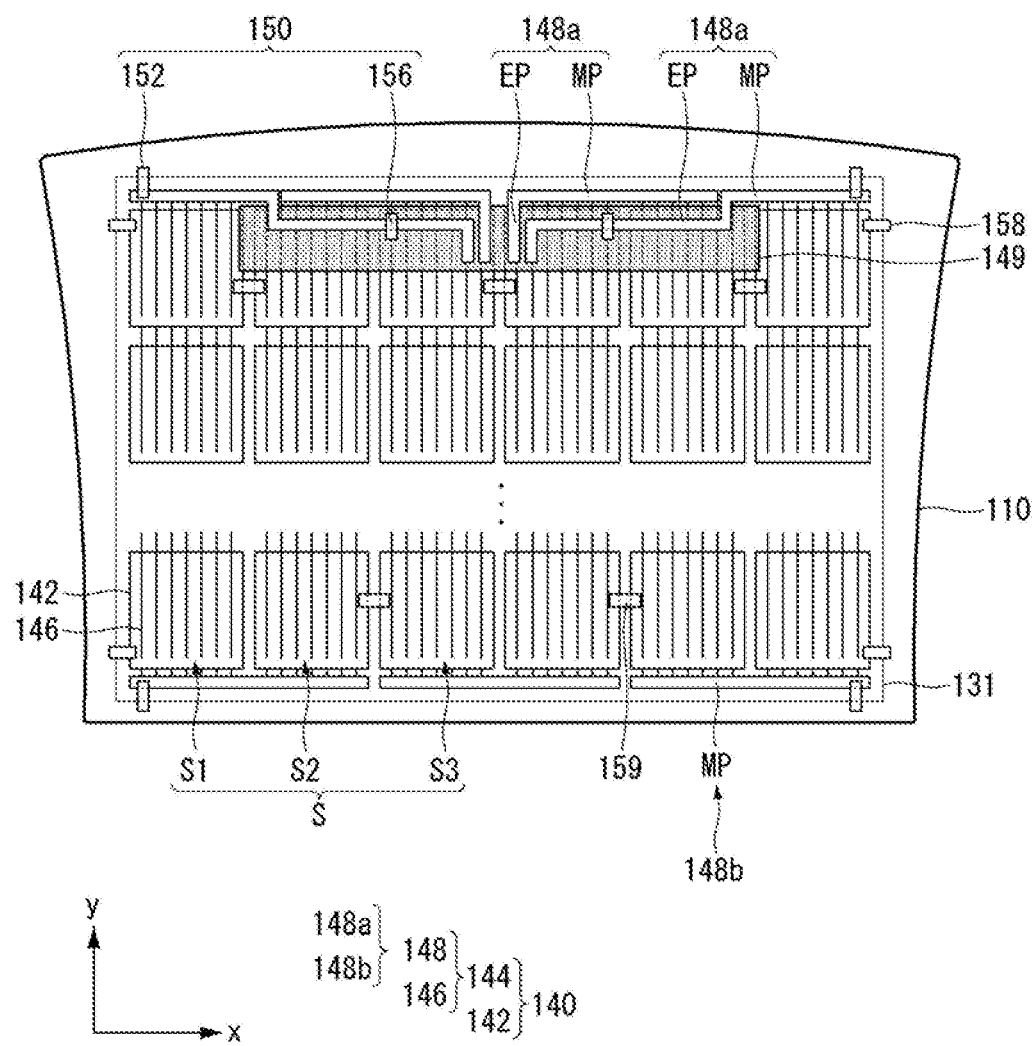
FIG. 6 illustrates a solar cell panel according to a modification of the present disclosure and is a rear plan view according to an embodiment of the present, in which a second sealing member, a second cover member, and a second fixing member are not illustrated.

As shown in FIGS. 3 and 6, the fixing member 150 can further include a third fixing member 156 for fixing the bus ribbon 148 and the insulating member 149 at the rear surfaces of the bus ribbon 148 and the insulating member 149. That is, since the insulating member 149 is positioned between the rear surfaces of the bus ribbon 148 and the solar cell 142, at least a portion of the bus ribbon 148 is positioned on the rear surface of the insulating member 149. In this instance, the third fixing member 156 for fixing the rear surfaces of the insulating member 149 and the bus ribbon 148 can be positioned on the rear surfaces of the insulating member 149 and the bus ribbon 148. Hence, the insulating member 149 can be fixed between the bus ribbon 148 and the solar cell 142 due to the simple structure.

The present embodiment illustrates that the third fixing member 156 fixes each of the first bus ribbons 148a positioned on both sides to the insulating member 149 in the symmetrical structure. Hence, the location fixing of the plurality of bus ribbons 148 (e.g., the plurality of first bus ribbons 148a) and the insulating member 149 can be more stably performed. The bus ribbon 148 can then be drawn from the central portion of the panel to the back side of the panel. In this embodiment, since the third fixing member 156 is separated from the other in the center portion, the bus ribbon 148 can be stably drawn out to the rear side of the panel. The present embodiment illustrates that the third fixing member 156 is positioned on a portion of the first bus ribbon 148a, and the third fixing member 156 is not positioned on another portion of the first bus ribbon 148a. That is, the present embodiment can reduce the number of third fixing members 156 although the third fixing members 156 are used to fix the bus ribbons 148 and the insulating member 149a. However, the present disclosure is not limited thereto, and the location, the number, etc. of third fixing members 156 can be variously changed. For example, the third fixing members 156 can individually fix all the bus ribbons 148, and one third fixing member 156 or the plurality of third fixing members 156 corresponding to the plurality of bus ribbons 148 can be used. Other modifications can be used.

The third fixing member 156 can include a base member 150a and an adhesive layer 150b in the same or similar manner as the first and/or second fixing members 152 and 154. The third fixing member 156 is fixed so that the adhesive layer 150b is positioned on the rear surface of the bus ribbon 148 and contacts the rear surface of the insulating member 149, and thus can fix the bus ribbon 148 to the rear surface of the insulating member 149. Since the base member 150a and the adhesive layer 150b of the third fixing member 156 can apply the description about the base member 150a and the adhesive layer 150b of the first and/or second fixing members 152 and 154, a detailed description thereof is omitted. A thickness of the third fixing member 156 can apply the description about the thickness of the first and/or second fixing members 152 and 154, and a length of an extension direction of the third fixing member 156 can be longer than a width of the third fixing member 156. Hence, the detailed description thereof is omitted. Here, the first to third fixing members 152, 154 and 156 can include the same material and structure and include different materials and structures.

The above description illustrates that the first fixing member 152 is positioned not to overlap the solar cell 142 and is directly connected to the solar cell 142 and the first cover member 110, and a fixing member for fixing them is not included. However, the present disclosure is not limited to the above description. For example, the first fixing member 152 can be attached to the rear surfaces of the bus ribbon 148 and the solar cell 142 and extended to the rear surface of the first cover member 110. Alternatively, as a modification thereof, as illustrated in FIG. 6, the fixing member 150 may not be overlapped or connected to the bus ribbon 148, and an additional fixing member 158 disposed to fix the solar cell 142 to the first cover member 110 at the rear surfaces of the solar cell 142 and the first cover member 110 can be further included. For reference, FIG. 6 illustrates a solar cell panel according to a modification of the present disclosure and is a rear plan view in which a second sealing member, a second cover member, and a second fixing member are not illustrated, as in FIG. 3.

Referring again to FIGS. 2 to 5, the present embodiment can further include an intercell fixing member 159 for fixing the plurality of solar cells 142. The intercell fixing member 159 can be fixed to rear surfaces of two adjacent solar cells 142. More specifically, because two solar cells 142 that are adjacent in the first direction are fixed by the interconnector 146, the intercell fixing member 159 can be positioned over two solar cells 142 that are adjacent in the second direction or two solar cell strings S that are adjacent in the second direction.

Here, the intercell fixing member 159 is not positioned on all the solar cells 142 and is positioned between some solar cells 142, and thus can reduce an amount used. For example, the intercell fixing member 159 can fix the plurality of solar cells 142 that are not connected by the bus ribbon 148. That is, the intercell fixing member 159 can be positioned over two solar cells 142 included in the two adjacent solar cell strings S (e.g., the first solar cell string S1 and the second solar cell string S2 or the two third solar cell strings S3 symmetrically positioned inside) that are not connected by the first bus ribbon 148a at one side of the first direction (the upper side in FIG. 3). Further, the intercell fixing member 159 can be positioned over two solar cells 142 included in the two adjacent solar cell strings S (e.g., the first solar cell string S1 and the second solar cell string S2) that are not connected by the second bus ribbon 148b at the other side of the first direction (the lower side in FIG. 3). Hence, a distance between the adjacent solar cells 142 that are not connected by the bus ribbon 148 can be stably fixed. However, the present disclosure is not limited to thereto, and the intercell fixing member 159 can be positioned at various locations.

The intercell fixing member 159 can include a base member 150a and an adhesive layer 150b in the same or similar manner as the first and/or second fixing members 152 and 154 (e.g., can be same or similar pieces of a type of meltable tape). The intercell fixing member 159 is fixed so that the adhesive layer 150b contacts rear surfaces of two solar cells 142 that are adjacent in the second direction, and can uniformly maintain a distance between the two solar cells 142 that are adjacent in the second direction. Since the base member 150a and the adhesive layer 150b of the intercell fixing member 159 can apply the description about the base member 150a and the adhesive layer 150b of the first and/or second fixing members 152 and 154, a detailed description thereof is omitted. A thickness of the intercell fixing member 159 can apply the description about the thickness of the first and/or second fixing members 152 and 154, and a length of an extension direction of the intercell fixing member 159 (a length of the intercell fixing member 159 in the second direction) can be greater than a width of the intercell fixing member 159 (a width of the intercell fixing member 159 in the first direction). Hence, the detailed description thereof is omitted. Here, the intercell fixing member 159 can include the same material and structure as the first to third fixing members 152, 154 and 156 and include a different material and structure from the first to third fixing members 152, 154 and 156. For example, if the first to third fixing members 152, 154 and 156 and the intercell fixing member 159 include the same material and structure, one type of member can be used to simplify the manufacturing process and reduce the process cost. However, the present disclosure is not limited to thereto.

The attachment location, the number, the attachment angle, etc. of the first fixing member 152, the second fixing member 154, the third fixing member 156, the intercell fixing member 159, and the additional fixing member 158 can be variously changed considering the curved shape of the solar cell panel 100 or the first cover member 110.

The present embodiment includes the fixing member 150 for fixing the first cover member 110 to the solar cell part 140 and/or the second cover member 120 and thus can stably fix a location of the solar cell part 140 and/or the second cover member 120 with respect to the first cover member 110. In particular, the fixing member 150 is applied to the vehicle 1 or applied when a location of the solar cell part 140 and/or the second cover member 120 with respect to the first cover member 110 can be undesirably changed due to the curved shape of the first cover member 110, thereby stably fixing the location of the solar cell part 140 and/or the second cover member 120 with respect to the first cover member 110. Hence, the reliability of the solar cell panel 100 can be improved.

In this instance, the present embodiment can improve the appearance of the solar cell panel by preventing a portion of the fixing member 150, that is positioned inside the sealing member 130 after the lamination process, from being easily recognized from the outside using the fixing member 150 of the melting type. In addition, the fixing member 150 of the melting type is filled without gaps between the sealing member 130 and a portion of the fixing member 150 positioned inside the sealing member 130 during the lamination process and thus can prevent the problem such as moisture penetration. Hence, the reliability of the solar cell panel 100 can be improved.

That is, the fixing member 150 can be applied to the vehicle 1 or improve the appearance and the reliability of the solar cell panel 100 with the curved shape.

A method for manufacturing the above-described solar cell panel 100 is described in detail below with reference to FIG. 7 and FIGS. 8A to 8F.

Figure 7:
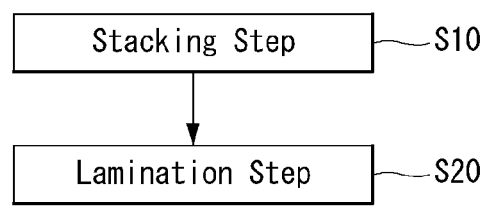
FIG. 7 is a flow chart illustrating a method for manufacturing a solar cell panel according to an embodiment of the present disclosure.

FIG. 7 is a flow chart illustrating a method for manufacturing a solar cell panel according to an embodiment of the present disclosure.

As illustrated in FIG. 7, a method for manufacturing a solar cell panel 100 according to an embodiment of the present disclosure includes a stacking step S10 and a lamination step S20.

First, in the stacking step S10, a first cover member 110, a first sealing member 131, a solar cell part 140, a second sealing member 132, and a second cover member 120 are placed in order, on top of each other, on a workbench of a lamination device, and are stacked in order using a fixing member 150 (e.g., including a plurality of different pieces) to form a stack structure. In this instance, in the present embodiment, the first cover member 110 with a curved shape is placed on the workbench of the lamination device, and the first sealing member 131, the solar cell part 140, the second sealing member 132, and the second cover member 120 positioned on the first cover member 110 can be stably laminated to have a shape corresponding to the curved shape of the first cover member 110. However, the present disclosure is not limited thereto, and other modifications can be used.

Next, in the lamination step S20, heat and pressure are applied to the stack structure. The first sealing member 131 and the second sealing member 132 are melted and then hardened and are compressed by the pressure to completely fill a space between the first cover member 110 and the second cover member 120. Hence, the first sealing member 131 and the second sealing member 132 can seal the solar cell part 140 while completely filling the space between the first cover member 110 and the second cover member 120. As a result, the solar cell panel 100 with a desired shape is manufactured.

The present embodiment fixes (e.g., temporarily fixes) locations of the first cover member 110, the first sealing member 131, the solar cell part 140, the second sealing member 132, and the second cover member 120 using (e.g., attaching) the fixing member 150 (e.g., can include multiple pieces of a type of meltable, transparent or semi-transparent tape) in the stacking step S10, and can prevent their locations from being undesirably changed in the lamination step S20. This is described in more detail with reference to FIGS. 8A to 8F.

FIGS. 8A to 8F are rear plan views illustrating a method for manufacturing a solar cell panel according to an embodiment of the present disclosure.

Figure 8A:
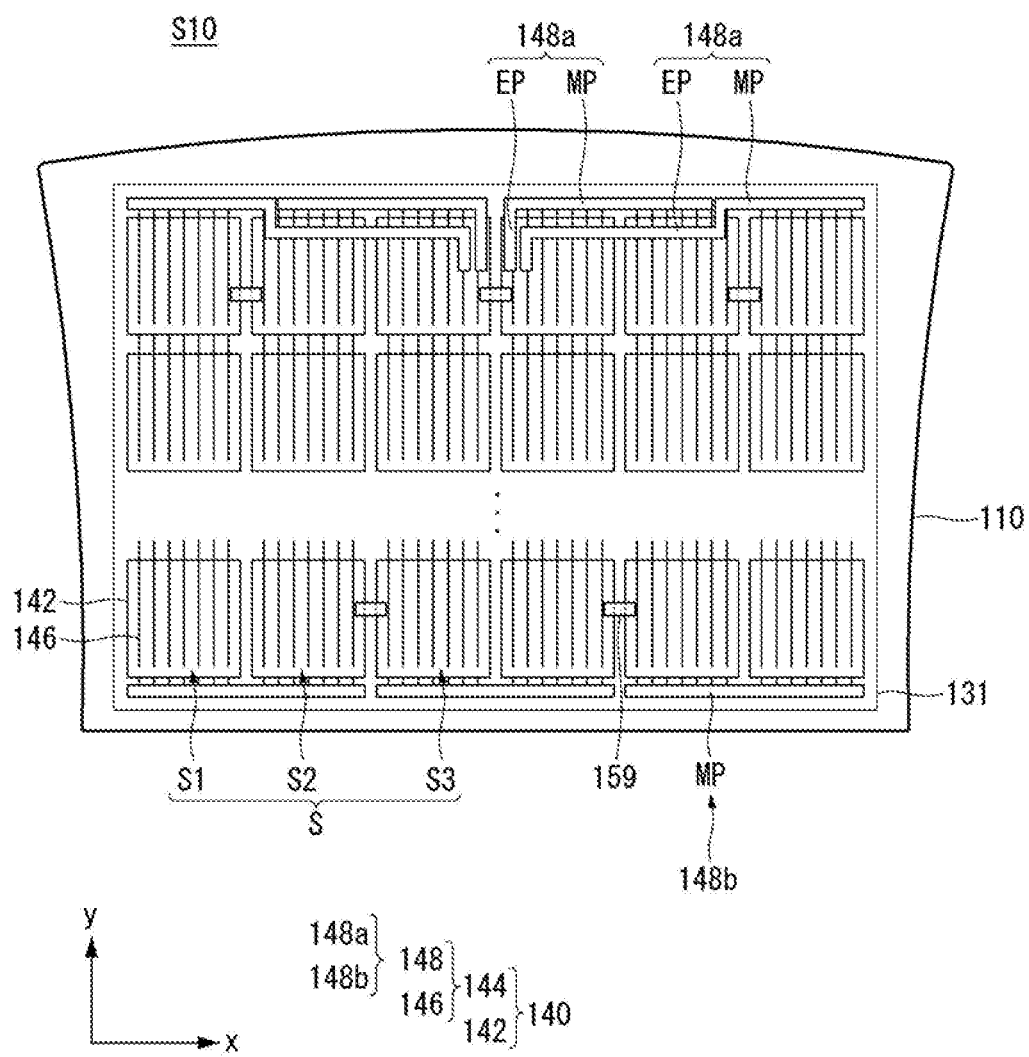
FIGS. 8A to 8F are rear plan views illustrating a method for manufacturing a solar cell panel according to an embodiment of the present disclosure.

As illustrated in FIG. 8A, the first sealing member 131 and the solar cell part 140 are positioned in order on the first cover member 110. For example, the first cover member 110 can be made of a glass substrate with a curved shape, and the first sealing member 131 can have an area equal to or greater an area of the solar cell part 140 in order to correspond to the entire solar cell part 140 and can have an area less than an area of the first cover member 110. In this instance, an intercell fixing member 159 is positioned on rear surfaces of a plurality of solar cells 142 of the solar cell part 140 and can uniformly maintain a distance between the plurality of solar cells 142.

Figure 8B:
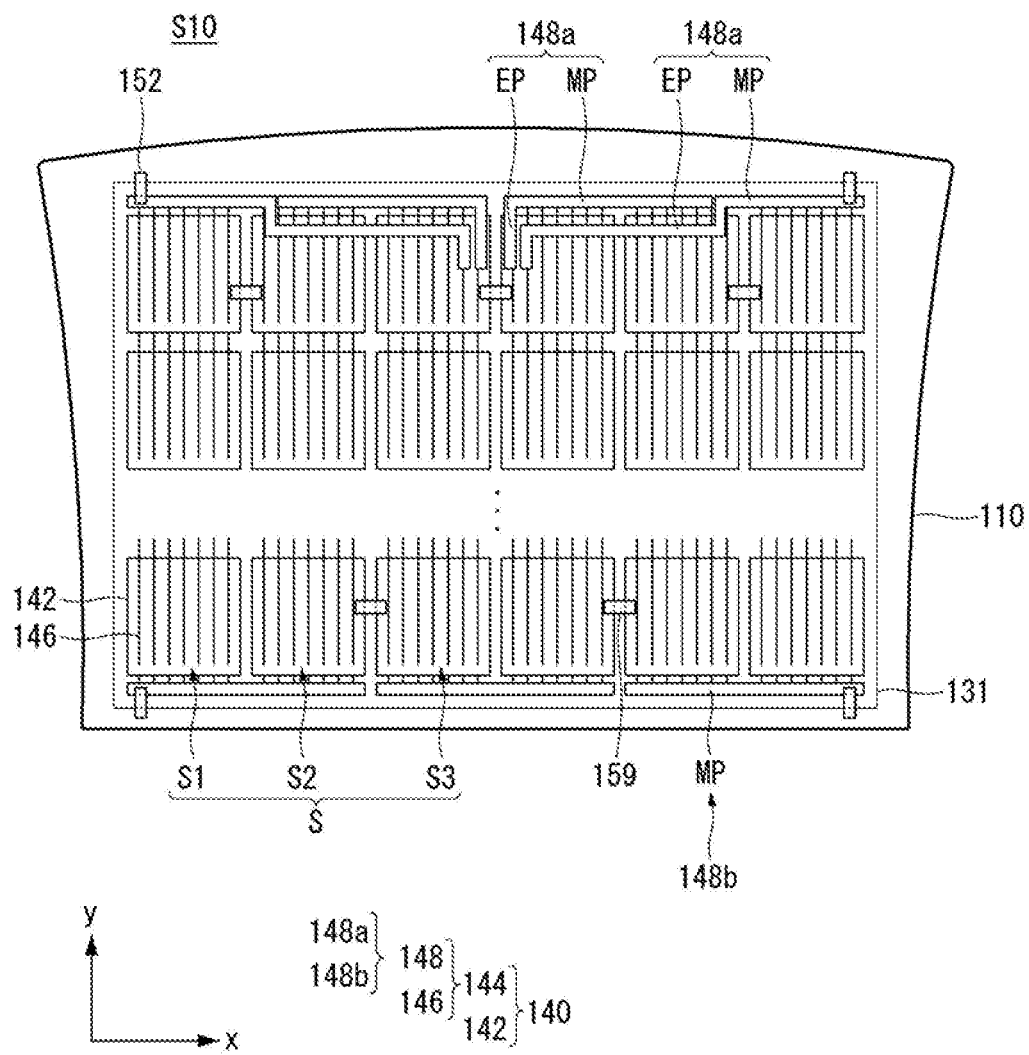

Next, as illustrated in FIG. 8B, a first fixing member 152 is positioned on rear surfaces of the first cover member 110 and the solar cell part 140 to fix the solar cell part 140 to the first cover member 110. For example, the first fixing member 152 can be positioned over a rear surface of a bus ribbon 148, at least the side of the first sealing member 131, and the rear surface of the first cover member 110. In this instance, an adhesive layer 150b of the first fixing member 152 can contact the rear surface of the bus ribbon 148, at least the side of the first sealing member 131, and the rear surface of the first cover member 110 and fix them. Hence, the solar cell part 140 can be stably fixed to the first cover member 110 at a desired location. As a modification, the solar cell part 140 and the first cover member 110 can be fixed additionally using an additional fixing member 158 (see FIG. 6).

Figure 8C:
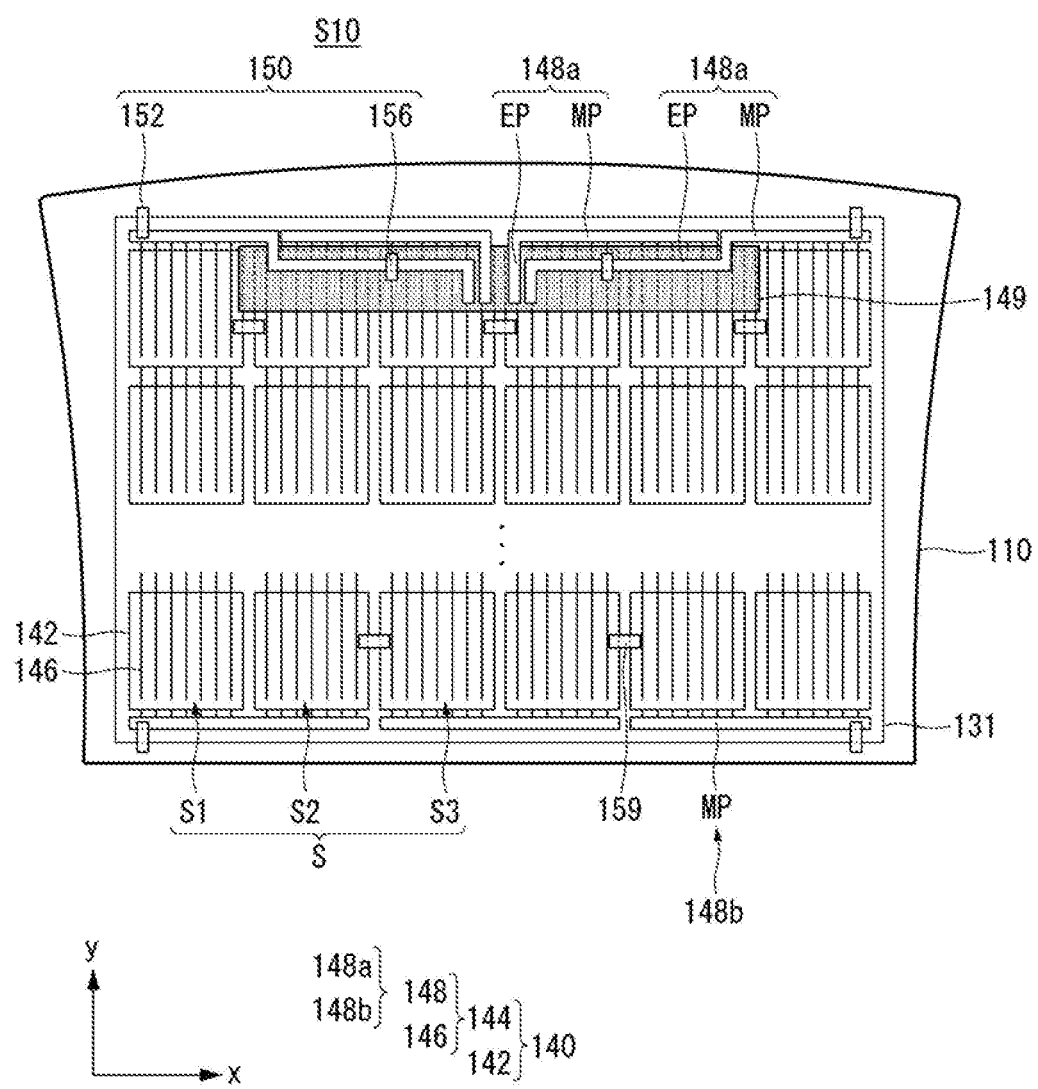

Next, as illustrated in FIG. 8C, an insulating member 149 can be positioned between the solar cell 142 and the bus ribbon 148 in an overlap portion of the solar cell 142 and the bus ribbon 148, and a third fixing member 156 can be positioned on rear surfaces of the bus ribbon 148 and the insulating member 149, thereby fixing the bus ribbon 148 to the insulating member 149. In this instance, an adhesive layer 150b of the third fixing member 156 can contact the rear surface of the bus ribbon 148 and the rear surface of insulating member 149 adjacent to the rear surface of the bus ribbon 148 and fix them.

According to this, the method checks a location, etc. of the solar cell part 140 (e.g., locations of the solar cell 142 and the bus ribbon 148 of the solar cell part 140) and fixes the solar cell part 140 to the first cover member 110, and then disposes the insulating member 149. Hence, even if the insulating member 149 is not transparent, the solar cell part 140 can be fixed at a desired location. However, the present disclosure is not limited thereto. For example, the method can first dispose the insulating member 149 and the third fixing member 156 at the solar cell part 140 and then fix the solar cell part 140 to the first cover member 110 using the first fixing member 152. Other orders of the method can be used.

Figure 8D:
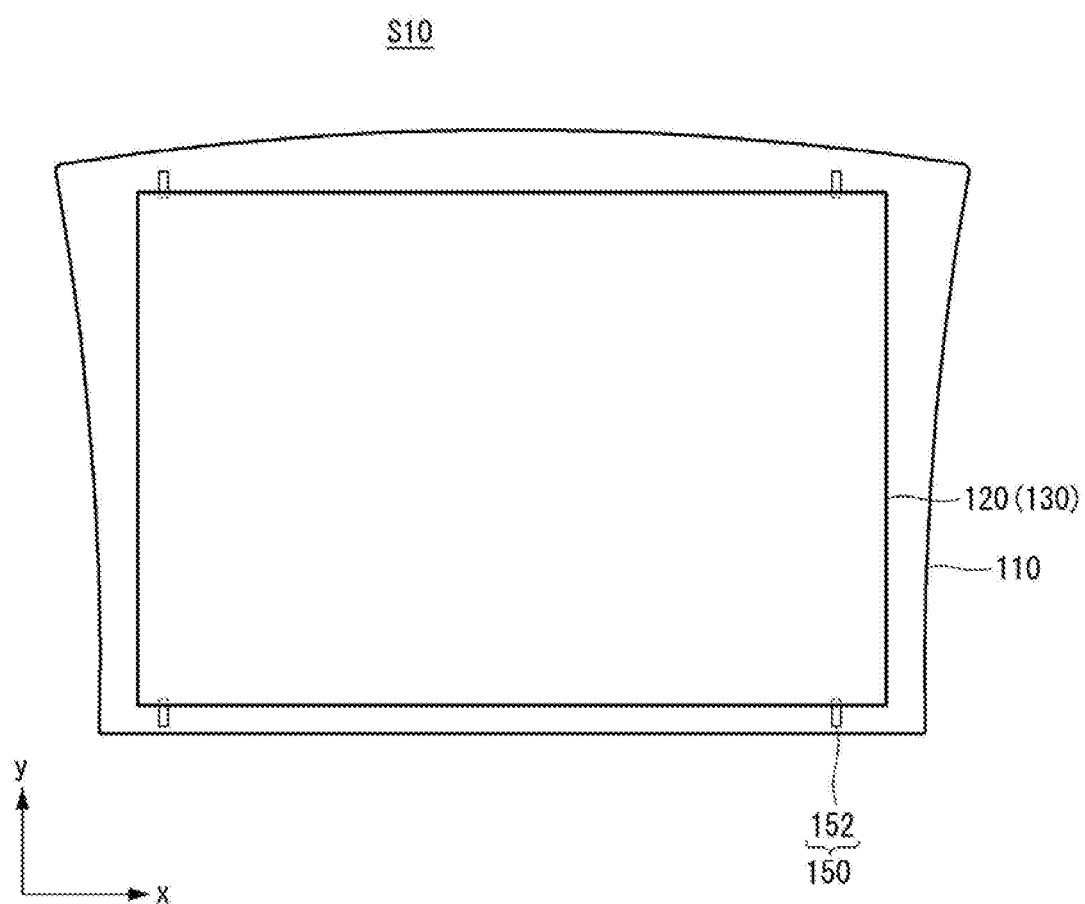

Next, as illustrated in FIG. 8D, the second sealing member 132 and the second cover member 120 are positioned in order on the first cover member 110, the first sealing member 131, and the solar cell part 140. FIG. 8D illustrates that the first sealing member 131, the second sealing member 132, and the second cover member 120 have the same area and entirely overlap each other, by way of example. However, the present disclosure is not limited thereto. For example, at least two of the first sealing member 131, the second sealing member 132, and the second cover member 120 have different areas, and other modifications can be used.

Figure 8E:
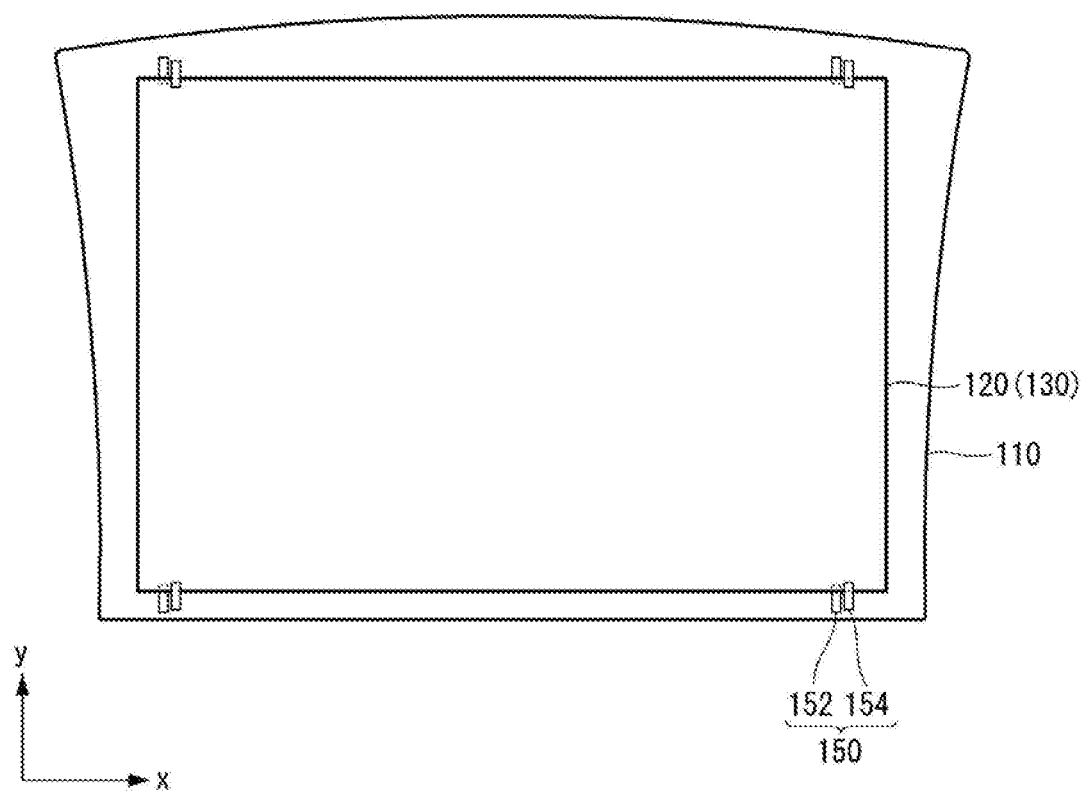

Next, as illustrated in FIG. 8E, a second fixing member 154 is positioned on the rear surfaces of the second cover member 120 and the first cover member 110 and fixes the second cover member 120 to the first cover member 110. For example, the second fixing member 154 can be positioned over the rear surface of the second cover member 120, at least the side of the first and second sealing members 131 and 132, and the rear surface of the first cover member 110. In this instance, an adhesive layer 150b of the second fixing member 154 can contact the rear surface of the second cover member 120, at least the side of the first and second sealing members 131 and 132, and the rear surface of the first cover member 110 and fix them. Hence, the second cover member 120 can be stably fixed to the first cover member 110. Further, the formation of the stack structure in the stacking step S10 can be completed.

Figure 8F:
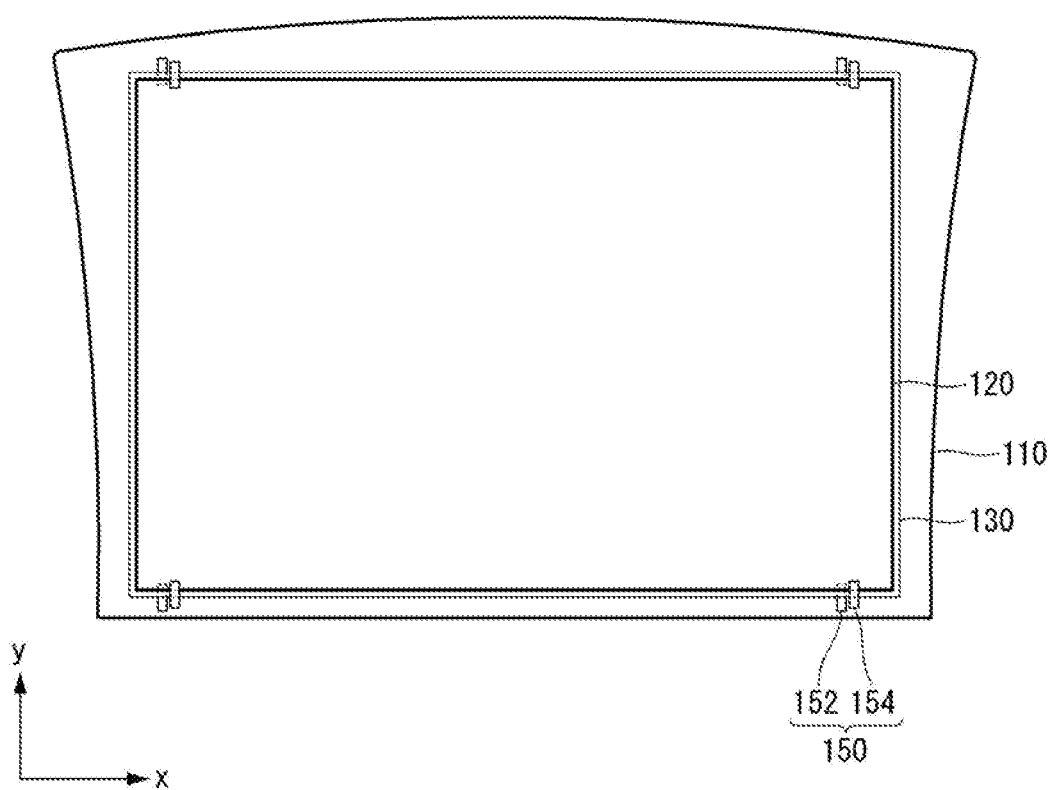

Next, as illustrated in FIG. 8F, the lamination step S20 of applying heat and pressure to the stack structure can be performed to complete the manufacture of the solar cell panel 100. For example, FIG. 8F illustrates that a sealing member 130 has a larger area than the area of the second cover member 120 while being pressed during the lamination process, by way of example. However, the present disclosure is not limited thereto. For example, the sealing member 130 can have an area that is equal to or less than the area of the second cover member 120.

In this instance, if the first and/or second fixing members 152 and 154, the third fixing member 156, the additional fixing member 158, etc. are a melting type configured to be softened and then again hardened together with the sealing member 130 in the lamination process. Therefore, a boundary between the fixing member 150 positioned inside the sealing member 130 and the sealing member 130 may not be easily recognized by the naked eye. Further, since the sealing member 130 and the fixing member 150 positioned inside the sealing member 130 are hardened in a state of adhering to each other without gaps between them, and problems, such as moisture penetration, can be prevented even if at least a portion of the fixing member 150 is positioned inside the sealing member 130.

As a result, the appearance and the reliability of the solar cell panel 100 can be improved by the simple process using the fixing member 150. In particular, the fixing member 150 is applied to the vehicle 1 or applied the manufacture of the solar cell panel 100 with the curved shape and thus can improve the appearance and the reliability of the solar cell panel 100.

FIG. 3 illustrates six solar cell strings S, by way of example. However, the present disclosure is not limited thereto. For example, the number of solar cell strings S, the number of solar cells 142 included in the solar cell string S, and the like can be variously changed.

FIG. 4 illustrates that the solar cell panel 100 has the curved shape, that is entirely symmetrical in the first direction, in a cross section along the second direction, by way of example. However, the present disclosure is not limited thereto. For example, the solar cell panel 100 can have the curved shape in one of the first and second directions and have a plane shape in other direction. The curved shape can also be implemented as a symmetrical, asymmetrical, and irregular shape, etc. Other modifications can be used.

The above embodiments described and illustrated that the solar cell panel 100 or the first cover member 110 has the curved shape. However, the present disclosure is not limited thereto. For example, even if the solar cell panel 100 or the first cover member 110 has a flat shape, the fixing stability of various layers included in the solar cell panel 100 can be improved by the fixing member 150. For example, if the fixing member 150 is used in the structure in which each of the first and second cover members 110 and 120 is made of a glass substrate, the fixing stability can be improved in the structure in which a heavy glass substrate is used on both sides.

The above embodiments described and illustrated that the solar cell panel 100 is used as a roof of the vehicle 1. However, the present disclosure is not limited thereto. For example, even if the solar cell panel 100 has a building integrated structure in which the solar cell panel 100 is integrated with the building, or is separately installed on the roof for the simple purpose of power generation, the fixing stability can be improved by the fixing member 150.

The features, structures, effects and the like according to the above-described embodiments are included in at least one embodiment of the disclosure and are not necessarily limited to one embodiment. Furthermore, the features, structures, effects and the like illustrated in each embodiment can be combined with other embodiments and modified by other persons skilled in the art to which embodiments belong. Therefore, it should be understood that descriptions related to these combinations and modifications are included in the range of the present disclosure.

What is claimed is:

1. A solar cell panel comprising:
   solar cell parts including a solar cell and a wiring member connected to the solar cell;
   a first cover member disposed at a front surface of the solar cell;
   a second cover member disposed at a rear surface of the solar cell;
   a sealing member disposed between the first cover member and the second cover member, the sealing member surrounding the solar cell parts; and
   one or more of a plurality of fixing members including at least one of a first fixing member and a second fixing member,
   wherein the first fixing member fixes at least part of one of the solar cell parts to the first cover member,
   wherein the second fixing member fixes the second cover member to the first cover member,
   wherein the first fixing member and the second fixing member are positioned side by side in a portion adjacent to an edge of the solar cell panel and in a direction crossing to an extension direction of the wiring member,
   wherein the sealing member includes a first sealing member on a front surface of the solar cell parts and a second sealing member on a rear surface of the solar cell parts,
   wherein the first fixing member is disposed between the first sealing member and the second sealing member, and is attached at a side surface of the sealing member and a rear surface of the first cover member, and
   wherein each of the plurality of fixing members includes a piece of tape including a base member and an adhesive layer formed on one surface of the base member.

2. The solar cell panel of claim 1, wherein the plurality of fixing members include a melting type of material.

3. The solar cell panel of claim 1, wherein the first cover member has a larger area than the second cover member or the sealing member, and
   wherein the first fixing member includes:
   an inside portion overlapping with the sealing member or the second cover member, and
   an outside portion extended from the inside portion and fixed to the rear surface of the first cover member.

4. The solar cell panel of claim 1, wherein each of the plurality of fixing members has a length in an extension direction and a width is less than the length.

5. The solar cell panel of claim 1, wherein the plurality of fixing members include a different material than the sealing member, and
   wherein a thickness of each of the plurality of fixing members is less than a thickness of the sealing member.

6. The solar cell panel of claim 1, wherein the wiring member includes a bus ribbon, and
   wherein the first fixing member fixes the bus ribbon to the first cover member, the first fixing member being disposed at a rear surface of the bus ribbon and at the rear surface of the first cover member.

7. The solar cell panel of claim 1, wherein the first fixing member is disposed on the at least part of the one of the solar cell parts without overlapping with the solar cell.

8. The solar cell panel of claim 1, wherein the solar cell includes a plurality of solar cells forming a solar cell string extended in one direction,
   wherein the plurality of fixing members include:
   the fixing member that fixes the first cover member to the at least part of the one of the solar cell parts, the first fixing member being disposed at the rear surface of the first cover member and at a rear surface of the at least part of the one of the solar cell parts; and the second fixing member that fixes the first cover member to the second cover member, the second fixing member being disposed at the rear surface of the first cover member and at a rear surface of the second cover member.

9. The solar cell panel of claim 1, wherein the wiring member includes a bus ribbon overlapping with at least a portion of the solar cell, wherein the solar cell panel further comprises an insulating member disposed between the solar cell and the bus ribbon to insulate the solar cell from the bus ribbon, and wherein the plurality of fixing members further include a third fixing member that fixes the bus ribbon to the insulating member, the third fixing member being disposed at a rear surface of the bus ribbon and at a rear surface of the insulating member.

10. The solar cell panel of claim 1, wherein the solar cell panel is configured to form at least part of a roof of a vehicle.

11. The solar cell panel of claim 1, wherein the solar cell panel has a curved shape.

12. The solar cell panel of claim 10, wherein the first cover member is made of a glass substrate having a curved shape.

* * * * *